United States Patent [19]

Takei

[11] Patent Number: 4,920,253

[45] Date of Patent: Apr. 24, 1990

[54] CONTROL DEVICE FOR A COOKING APPARATUS WHICH CONTROLS A PLURALITY OF FUNCTIONS USING A SINGLE RESISTANCE ELEMENT

[75] Inventor: Tamotsu Takei, Nagoya, Japan

[73] Assignee: Kabushiki Kaisha Toshiba, Japan

[21] Appl. No.: 293,611

[22] Filed: Jan. 5, 1989

Related U.S. Application Data

[63] Continuation of Ser. No. 65,370, Jun. 23, 1987, abandoned.

[30] Foreign Application Priority Data

Jun. 24, 1986 [JP] Japan .................................. 61-147535
Oct. 24, 1986 [JP] Japan .................................. 61-253205

[51] Int. Cl.$^5$ .................................................. H05B 1/02
[52] U.S. Cl. ............................ 219/506; 219/492; 219/508; 341/24; 341/26; 338/99; 338/114
[58] Field of Search .............. 219/10.55 B, 492, 497, 219/494, 507–509, 505; 307/116, 10.1, 108; 341/22, 151, 24, 26; 338/99, 92, 114, 95, 71; 323/904

[56] References Cited

U.S. PATENT DOCUMENTS

| | | | |
|---|---|---|---|
| 3,624,583 | 11/1971 | Nakada | 338/95 |
| 4,121,204 | 10/1978 | Welch et al. | 307/116 |
| 4,145,584 | 3/1977 | Otterlei | 200/5 A |
| 4,149,217 | 4/1979 | Tucker | 219/506 |
| 4,221,975 | 9/1980 | Ledniczki et al. | 307/116 |
| 4,301,337 | 11/1981 | Eventoff | 200/5 A |
| 4,424,458 | 1/1984 | Buck et al. | 307/308 |
| 4,575,601 | 3/1986 | Taguchi et al. | 200/5 A |
| 4,594,482 | 6/1986 | Saito et al. | 200/5 A |
| 4,631,525 | 12/1986 | Serravalle, Jr. | 307/116 |
| 4,737,656 | 4/1988 | Cottlieb | 307/10.1 |

OTHER PUBLICATIONS

Brochure "Noble '86", published by Teikoku Tsushin Kogyo Co., Ltd., This brochure discloses a sheet volume in p. 9 thereof.

Primary Examiner—M. H. Paschall
Attorney, Agent, or Firm—Cushman, Darby & Cushman

[57] ABSTRACT

A control device for cooking apparatus includes an input panel for inputting a desired cooking condition. The input panel includes a flexible panel on which a plurality of cooking condition set key-patterns are formed in line. When a desired cooking condition set key-pattern is pressed, the input panel produces a voltage corresponding to the pressed key-pattern. The value of this voltage is changed step by step from one side key-pattern toward the other side key-pattern on the flexible panel.

15 Claims, 6 Drawing Sheets

CONTROL DEVICE FOR A COOKING APPARATUS WHICH CONTROLS A PLURALITY OF FUNCTIONS USING A SINGLE RESISTANCE ELEMENT

This is a continuation of application Ser. No. 07/065,370 now abandoned, filed Jun. 23, 1987, which was abandoned upon the filing hereof.

BACKGROUND OF THE INVENTION

1. Field of the Invention

This invention relates, in general, to cooking apparatus. More specifically, the invention relates to a control panel for a cooking apparatus through which a user may input desired cooking conditions, such as, e.g., cooking time or a desired cooking mode.

2. Description of the Prior Art

Well known cooking apparatus, such as microwave ovens, typically are provided with a control panel. A plurality of cooking condition keys, such as, e.g., a start key, a cancel key, a plurality of cooking mode keys, etc. normally are arranged on the control panel.

An example of the above-described control panel is disclosed in U.S. Pat. No. 4,145,584 issued on Mar. 20, 1979 in the name of Jon L. Otterlei, and entitled FLEXIBLE KEYBOARD SWITCH WITH INTEGRAL SPACER PROTRUSIONS. In this prior art, a plurality of cooking condition set keys including a plurality of cooking mode keys, a cancel key, a start key etc., are provided on one side of a fold line of a Mylar sheet. A plurality of conductive areas corresponding to the cooking condition set keys are arranged on the corresponding rear surface of the Mylar sheet. A key-matrix circuitry comprises those conductive areas connected to one another. A plurality of key scanning signal lines connected between the key-matrix circuitry and a main control section are formed on the rear surface of the Mylar sheet. A plurality of conductive elements corresponding to the conductive areas are provided on the rear surface of the Mylar sheet at the opposite side of the fold line from the set keys. Each conductive element includes a pair of terminals. A key signal line formed on the opposite side of the rear surface is connected to each conductive element. When the sheet is folded along the fold line, each conductive area of one side surface and the corresponding conductive element come into appositon, to act as a fixed contact of a normally open single-pole single-throw switch. For example, when a desired key is pressed, the corresponding conductive area comes into contact with the opposite conductive element. Therefore, the conductive area makes the pair of terminals of the conductive element electrically contact with one another therethrough.

In this arrangement described above, since a large number of signal lines are provided on one sheet, the arrangement of those signal lines is complicated, and a large sheet is needed for arranging those signal lines and the cooking condition set keys.

SUMMARY OF THE INVENTION

It is an object of the present invention to simplify the construction of an input panel for a cooking apparatus.

To accomplish above object, the cooking apparatus includes a control panel wherein a flexible panel is provided. A plurality of cooking condition set key-patterns are formed on the flexibel panel. When a desired cooking condition set key-pattern is operated, the flexible panel outputs a voltage corresponding to the desired cooking condition set key-pattern. The voltage output from the flexible panel is changed step by step from one side key pattern of the cooking condition set key patterns toward the other side key-pattern.

The cooking condition set key-patterns may include a cooking time scale pattern for inputting a desired cooking time.

BRIEF DESCRIPTION OF THE DRAWINGS

The present invention is best understood with reference to accompanying drawings in which.

DETAILED DESCRIPTION OF THE PREFERRED EMBODIMENTS

The preferred embodiments of the present invention will now be described in more detail with reference to the accompanying drawings.

Figure 1:
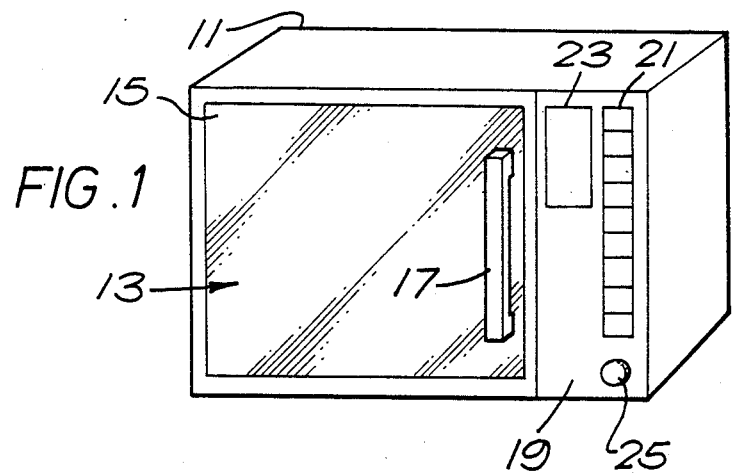
FIG. 1 is a perspective view illustrating one embodiment of the present invention.

FIG. 1 is a perspective view of a microwave oven. A microwave oven 11 is provided with a cooking chamber (not shown) therein. A front door 13 is hinged at the front side of microwave oven 11 to open and close the cooking chamber. In general, front door 13 includes a transparent panel 15 to enable a user to see food disposed in the cooking chamber during cooking. A handle 17 is provided on the side of transparent panel 15 opposite to the hinged portion of front door 13. An operational panel 19 is provided on the front side of microwave oven 11 adjacent to front door 13. Operation panel 19 is provided with an input panel 21 for inputting desired cooking conditions. Operation panel 19 also is provided with a digital display 23 for displaying cooking information, such as the inputted desired cooking mode. A time knob 25 also is provided on operation panel 19 for setting a desired cooking time.

Figure 2:
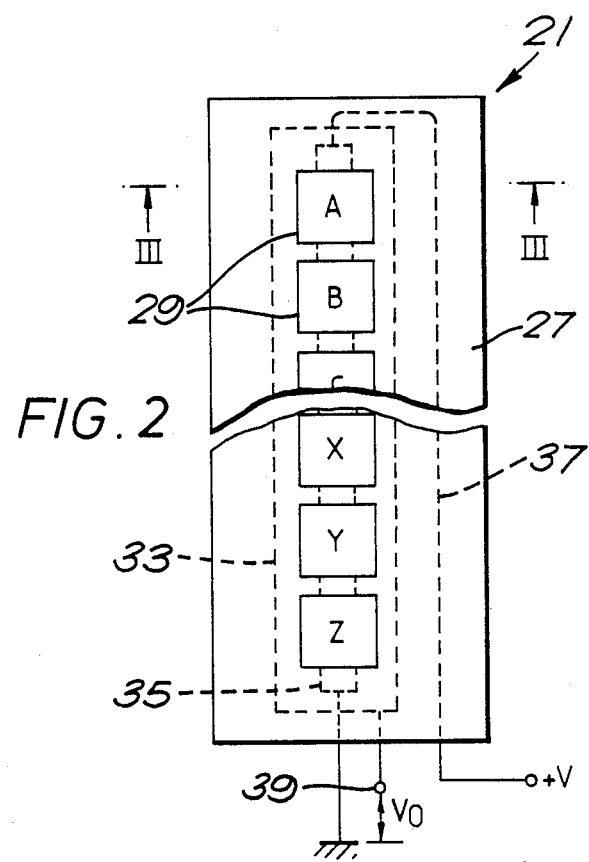
FIG. 2 is an enlarged plan view illustrating an input panel as shown in FIG. 1.
Figure 3:
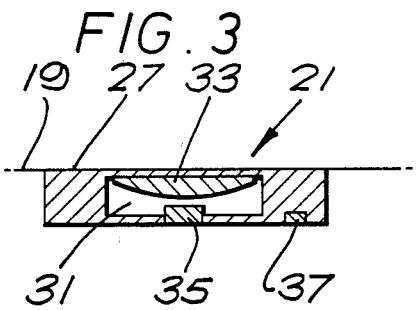
FIG. 3 is a cross-sectional view taken on line III—III of FIG. 2.

As shown in FIG. 2, input panel 21 includes an elongated elastic sheet 27 on which a plurality of cooking condition set key-patterns 29 are formed. The cooking condition key-patterns are arranged at prescribed intervals along the elongated direction of sheet 27. Cooking condition key-patterns 29 include cooking mode keys, a cooking start key, etc. Elastic elongated sheet 27 is provided with an elongated hollow portion 31 therein. A flexible electric conductive layer 33 is provided, in the elongated direction of sheet 27, on the one surface of hollow portion 31 corresponding to the front surface of sheet 27. The cooking condition set key-patterns 29 are formed thereon, as shown in FIG. 3. Conductive layer 33 is formed in an arc-shape. An elongated plate-shaped resistor 35 is provided on the other surface of hollow portion 31 opposite to conductive layer 33. A conductive lead pattern 37 also is provided in elongated sheet 27 in parallel to plate-shaped resistor 35, as shown in FIGS. 2 and 3. One end of plate-shaped resistor 35 is connected to lead pattern 37, and the other end thereof is grounded for applying DC voltage +V to resistor 35 through lead pattern 37. A terminal 39 is connected to one side of conductive layer 33. Input panel 21 with the above-described construction is arranged on operation panel 19 such that the front surface of elastic sheet 27 is flush with operation panel 19.

Figure 4:
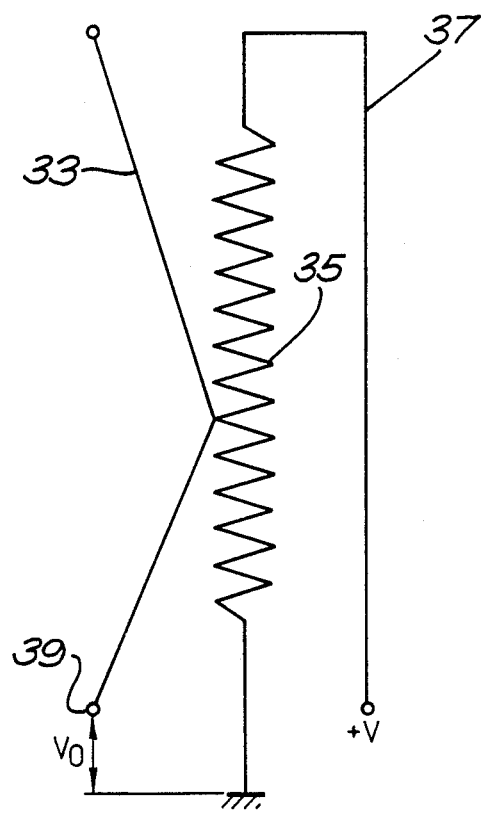
FIG. 4 is a view for explaining the operation of the input panel shown in FIGS. 2 and 3.

As can be understood from FIG. 4, when a desired cooking condition set key-pattern is pressed, the portion of conductive layer 33 corresponding to the desired cooking conditions set key-pattern deforms, and comes into contact with the corresponding portion of resistor 35. As a result, a prescribed voltage Vo is produced between terminal 39 and the other side (grounded side) of resistor 35.

Figure 5:
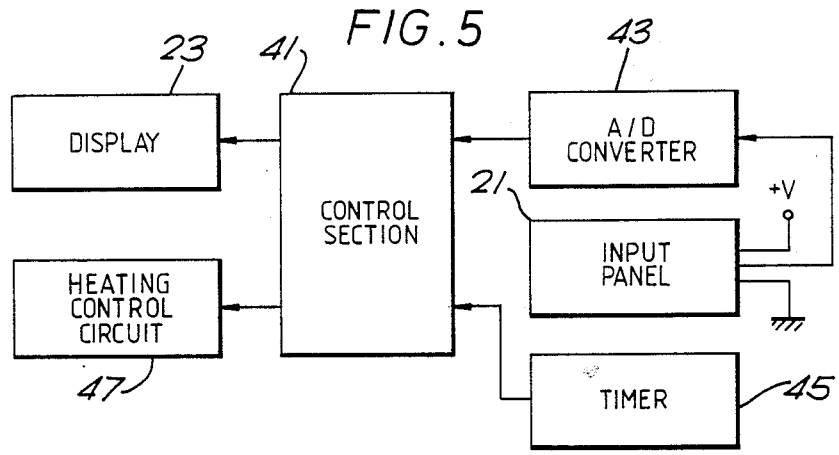
FIG. 5 is a circuit diagram of the embodiment shown in FIG. 1.
Figure 6:
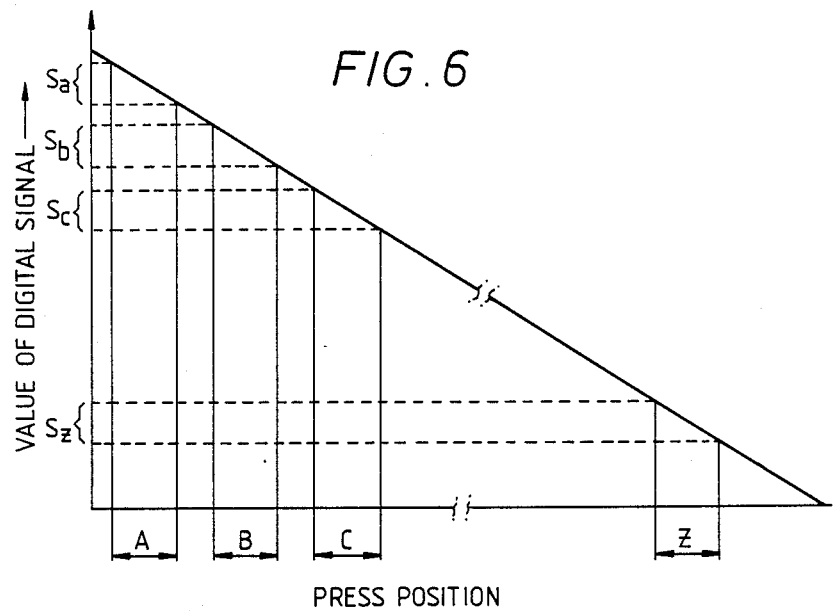
FIG. 6 is a graph showing the relationship between cooking condition set key-pattern and each value of the digital signal of an A/D converter shown in FIG. 5.

FIG. 5 is a control block diagram of the above-described oven. Key-signal data from input panel 21 is input to a control section 41 through an A/D (analog/digital) converter 43. Control section 41 includes a microcomputer and its peripheral control unit. Cooking time data set by timer knob 25 is input from a mechanical timer 45 to control section 41. Control section 41 controls display 23 for displaying the desired cooking mode or other cooking information. Control section 41 also controls a heating control circuit 47 for controlling output of a magnetron (not shown) in accordance with those input data. As shown in FIG. 6, when each cooking condition set key-pattern is pressed, the corresponding digital signal (Sa, Sb, Sc, . . . , or Sz) is generated from A/D converter 43. The relationship between each cooking condition key-pattern and the corresponding digital signal (hereinafter referred to as KEY TABLE) is previously stored in a ROM (read only memory) in control section 41.

The operation of the above-described construction will be described hereafter. First, food is put in the cooking chamber of oven 11. When the user presses a desired cooking mode key-pattern arranged on input panel 21, A/D converter 43 outputs the digital signal corresponding to the voltage Vo produced from input panel 21. The microcomputer of control section 41 receives thre digital signal, as described above. According to the digital signal, the microcomputer reads out the desired cooking mode from the ROM in which the KEY TABLE is stored. For example, the desired cooking mode is displayed in display 23. In accordance with the cooking mode read out from the ROM, the microcomputer energizes the magnetron through heating control circuit 47.

According to the above-described embodiment, input panel 21 comprises elongated flexible conductive layer 33 and elongated plate-shaped resistor 35 opposite to one another. The voltage Vo between layer 33 and resistor 35 varies in accordance with the position at which conductive layer 33 contacts with resistor 35 when a desired cooking condition set key-pattern is pressed. Based on the voltage Vo from input panel 21, A/D converter 43 generates the corresponding digital signal. Therefore, since a large number of signal lines of the above-described prior art are eliminated, the construction of the input panel may be simplified. In addition, the manufacturing cost of an input panel may be reduced.

Figure 7:
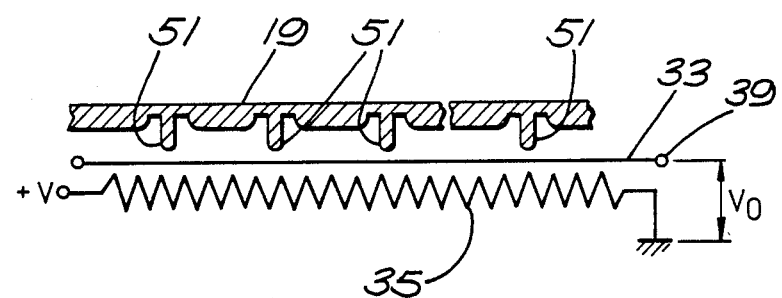
FIG. 7 is a schematic view of a second embodiment of the present invention.
Figure 8:
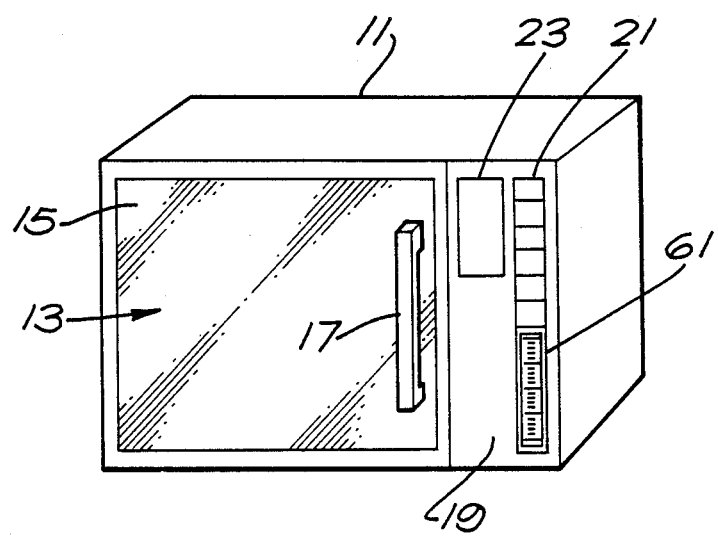
FIG. 8 is a perspective view illustrating a third embodiment of the present invention.
Figure 9:
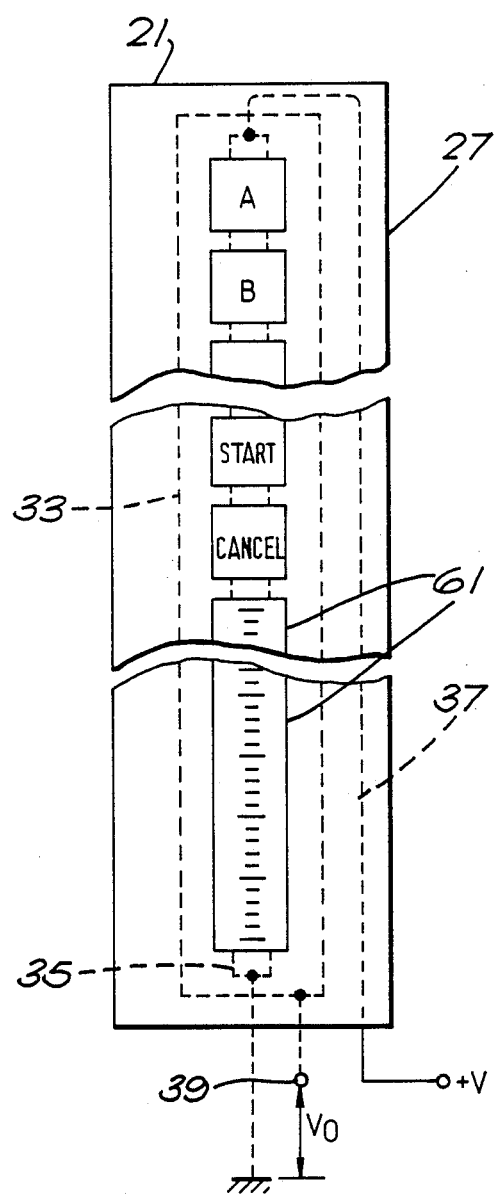
FIG. 9 is an enlarged plan view illustrating an input panel, as shown in FIG. 8.
Figure 10:
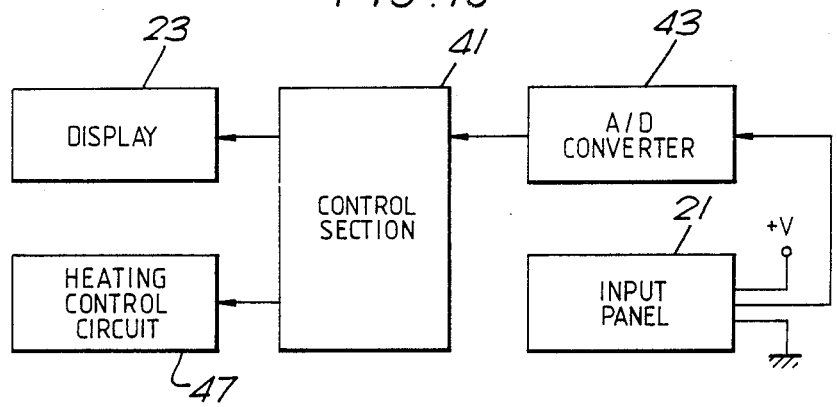
FIG. 10 is a circuit diagram of the third embodiment shown in FIG. 8.

FIG. 7 is a schematic view illustrating a second embodiment of the presnt invention. In this embodiment, a plurality of cooking condition set key-patterns are provided on operation panel 19. A plurality of press-bar elements 51 corresponding to cooking condition set key-patterns perpendicularly project from the rear surface of operation panel 19 at prescribed intervals. The area around each press-bar element 51 of the rear surface of operation panel 19 is concaved toward the front surface thereof to easily reciprocate press-bar element 51. Conductive layer 33 is positioned apart therefrom between operation panel 19 and resistor 35.

In the second embodiment described above, when a desired cooking condition set key-pattern on operation panel 19 is pressed, press-bar element 51 comes in contact with conductive layer 33 at a point. Therefore, conductive layer 33 and resistor 35 produce one voltage Vo corresponding to each press-bar element 51 of cooking condition set key-pattern. A/D converter 43 outputs a digital signal based on the voltage Vo. Accordingly the microcomputer of control section 41 may exactly identify the desired cooking condition on the basis of the digital signal fed from A/D converter 43.

Figure 11:
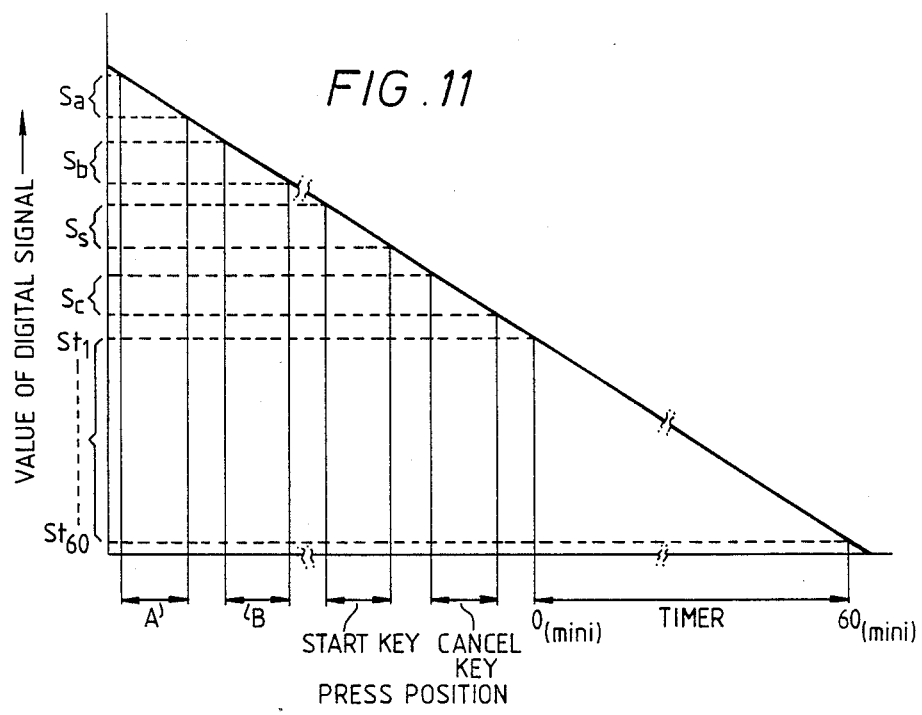
FIG. 11 is a graph showing the relationship between cooking condition set key-pattern and each value of the digital signal of an A/D converter shown in FIG. 10.

FIGS. 8, 9, 10 and 11 show a third embodiment of the present invention. In this third embodiment, the cooking time scale pattern 61 of a cooking timer is provided on elastic sheet 27, instead of mechanical timer 45 shown in FIG. 5. As shown in FIG. 11, when the user presses a desired portion of the time scale pattern, the corresponding voltage Vo is produced between conductive layere 33 and resistor 35, as described before. A/D converter 43 provides a digital signal (St1,—, or St60) representing the desired cooking time to control section 41 after receiving the voltage Vo from input panel 21. After that, as described above, the microcomputer of control section 41 controls the oscillating period of the magnetron through heating control circuit 47 in accordance with the digital signal from A/D converter 43 representing the desired cooking time.

With the third embodiment described above, since the cooking time set function is provided on the input panel, a mechanical timer may be eliminated, and the construction of a cooking timer may be simplified further.

In the third embodiment, a temperature scale pattern for inputting desired temperature data may be provided on the input panel. Furthermore, it may use one scale pattern both as a cooking time scale and a temperature scale.

The present invention has been described with respect to specific embodiments. However, other embodiments based on the principles of the present invention will be obvious to those of ordinary skill in the art. Such embodiments are intended to be covered by the claims.

What is claimed is:

1. A control device for a cooking apparatus, comprising:
    input means for allowing designation of commands of a plurality of different cooking conditions, including a plurality of manually operable contact keys;
    common resistance means responsive to a manual operation of the contact keys, for generating a voltage within a defined range corresponding to one of the contact keys which has been operated, including a single, continuous resistance element, across which a voltage is applied, and an area of which is connected to produce a voltage based on which key has been operated; and processor means responsive to the voltage from the resistance means for determining whether said voltage from said resistance means is any one of a plurality of acceptable voltages, generated by a corresponding proper depressing of said input means or an unacceptable voltage having a value between two adjacent acceptable voltages generated by an improper depressing of said input means and for recognizing one of the plurality of commands based on the acceptable voltage, the processor means overriding the unacceptable voltage from the resistance means for avoiding a false recognition of the designated command thereby.

2. A control device according to claim 1, wherein the input means includes flexible sheet means movable over a prescribed distance, the contact keys being arranged on the flexible sheet means for connecting to an area of said resistor element upon selective movement of the flexible sheet means.

3. A control device according to claim 2, wherein each of the contact keys includes a conductive material on the flexible sheet means for direct contact with the common resistance means.

4. A control device according to claim 2, wherein the input means also includes a conductive layer, and each key includes a protrusion for contacting a predetermined point on the conductive layer with the area of the resistance means upon manual operation of the key.

5. A control device according to claim 2, wherein the input means also includes a flexible conductive material on the sheet means, and the common resistance means includes an elongated plate-shaped resistor opposite to the conductive material.

6. A control device according to claim 5 also including timer means coupled to the processor means for controlling the cooking time of the apparatus.

7. A control device according to claim 5, wherein the contact keys include a timer key for inputting a desired cooking time data.

8. A control device according to claim 1, wherein the processor means A-D includes converter means for converting the voltage from the resistance means to a digital signal.

9. A control device as in claim 1 wherein said single resistance element is substantially flat and rectangular in cross-section, each said key of said input means including a conductive layer having a bottom surface which is substantially curved and is located over said respective areas of said resistance element.

10. A device as in claim 1, further comprising a wiring harness consisting of a ground wire, a power supply wire, and a control voltage wire.

11. A control device for a cooking apparatus comprising:

flexible panel means for displaying a plurality of cooking condition set key-patterns thereon at respective locations thereof, a location of the panel means being moved by a prescribed distance when a desired cooking condition set key-pattern at said one of said locations is pressed to command said desired cooking condition;

common resistor means, including a single, continuous resistor element biased with a voltage at one end thereof;

movable electric conductor means responsive to said panel means being moved by said prescribed distance, for contacting an area on the resistor element in response to the press operation of the desired set key-pattern to produce a voltage based on said location which is moved;

means for converting the voltage from the resistor means to a digital signal representating said location; and control means for determining whether said digital signal represents any one of a plurality of acceptable voltages generated by a corresponding depressing of said flexible panel means at a location corresponding to a desired cooking condition set key-pattern or represents an unacceptable voltage having a value between adjacent acceptable voltages and generated by depressing said flexible panel means at an area outside any of said desired cooking conditions, and for executing the desired cooking operation on the basis of a digital signal indicative of an acceptable voltage from the converting means, the control means overriding a digital signal indicative of an unacceptable voltage for avoiding the execution of a cooking operation other than the desired cooking operation.

12. A control device according to claim 11, wherein the electric conductors means includes a flexible elongated conductive plate for moving the prescribed distance in response to the movement of the panel means.

13. A control device according to claim 12, wherein the resistor means includes elongated resistance plate opposite to the elongated conductive plate of the conductor means.

14. A control device according to claim 1, wherein the cooking condition set key-patterns include a cooking time scale pattern for inputting a desired cooking time.

15. A control device as in claim 11 wherein said single resistor element is substantially flat and rectangular in cross-section, said movable electric conductor means including a conductive layer having a plurality of bottom surfaces which are substantially curved and located over said respective locations of said resistor element.

* * * * *